(12) United States Patent
Huang

(10) Patent No.: US 11,653,518 B2
(45) Date of Patent: May 16, 2023

(54) OLED DISPLAY PANEL HAVING BARRIER CONTROL LINE

(71) Applicant: SEEYA OPTRONICS CO., LTD., Shanghai (CN)

(72) Inventor: Zhongshou Huang, Shanghai (CN)

(73) Assignee: SEEYA OPTRONICS CO., LTD., Shanghai (CN)

( * ) Notice: Subject to any disclaimer, the term of this patent is extended or adjusted under 35 U.S.C. 154(b) by 122 days.

(21) Appl. No.: 17/106,218

(22) Filed: Nov. 30, 2020

(65) Prior Publication Data

US 2021/0336180 A1 Oct. 28, 2021

(30) Foreign Application Priority Data

Apr. 23, 2020 (CN) .......................... 202010327503.5

(51) Int. Cl.
*H01L 51/50* (2006.01)
*H01L 27/32* (2006.01)
*H01L 51/52* (2006.01)

(52) U.S. Cl.
CPC ...... *H01L 51/5096* (2013.01); *H01L 27/3246* (2013.01); *H01L 27/3276* (2013.01); *H01L 51/5206* (2013.01)

(58) Field of Classification Search
CPC ............. H01L 51/5096; H01L 27/3246; H01L 27/3276; H01L 51/5206
See application file for complete search history.

(56) References Cited

U.S. PATENT DOCUMENTS

| 2016/0118449 | A1 | 4/2016 | Sato et al. |
| 2016/0380035 | A1* | 12/2016 | Cho ..................... H01L 51/5056 257/40 |
| 2018/0151631 | A1 | 5/2018 | Lee et al. |
| 2018/0190731 | A1* | 7/2018 | Park ..................... H01L 27/3246 |
| 2018/0375052 | A1 | 12/2018 | Yang |

FOREIGN PATENT DOCUMENTS

| CN | 107104130 | | 8/2017 |
| CN | 108122943 | | 6/2018 |
| CN | 108598140 A | * | 9/2018 |
| CN | 111463357 | | 7/2020 |
| KR | 20170050730 A | * | 5/2017 |
| KR | 20200029885 A | * | 3/2020 |

OTHER PUBLICATIONS

Extended European Search Report dated Jun. 24, 2021 in corresponding European Application No. 21153960.6.
First Office Action dated Nov. 4, 2022 for Corresponding Chinese Patent Application No. CN 202010327503.5.

* cited by examiner

*Primary Examiner* — Peter Bradford
(74) *Attorney, Agent, or Firm* — Duane Morris LLP

(57) ABSTRACT

A display panel includes: a substrate; a first electrode layer disposed on one side of the substrate; a pixel definition layer with a plurality of opening structures disposed on one side of the first electrode layer facing away from the substrate, where the opening structure exposes part of first electrodes. The barrier control gate is then disposed on the pixel definition layer. The first-type carrier layer, then is the light-emitting layer, the second-type carrier layer, and finally the second electrode layer, are sequentially deposit on the display panel as formed above.

15 Claims, 15 Drawing Sheets

OLED DISPLAY PANEL HAVING BARRIER CONTROL LINE

CROSS-REFERENCES TO RELATED APPLICATIONS

This application claims the priority to a Chinese patent application No. CN202010327503.5 filed Apr. 23, 2020, which is incorporated herein by reference in its entirety.

TECHNICAL FIELD

The present disclosure relates to display technologies and, in particular, to a display panel and a display apparatus.

BACKGROUND

Organic light-emitting display panels have gradually become the mainstream of mobile display terminal screens and medium to large size displays. The organic light-emitting display (OLED hereinafter) panel generally includes multiple sub-pixels arranged in an array. Each sub-pixel includes a pixel driving circuit and a light-emitting element electrically connected to the pixel driving circuit.

Each light-emitting element includes an organic multi-layer sandwiched by a first electrode and a second electrode, where the organic multilayer includes a hole transport layer, a light-emitting layer and an electron transport layer that are stacked in evaporation sequence. In order to increase the display resolution, or to fabricate a display panel on a small silicon die, a white OLED formed by the organic multilayer combined with RGB color filter becomes a valid solution, where the multiple organic layers are continuously evaporated onto the OLED panel in a vacuum chamber without using shadow mask. However, due to a high conductivity of the hole transport layer, a lateral leakage current occurs through the hole transport layer whenever a voltage difference between adjacent sub-pixel presents. The lateral leakage current will reduce the signal voltage in each sub-pixel, and result in blurred display image and reduced chromaticity in the display image.

SUMMARY

The present disclosure provides a display panel to reduce the leakage current between adjacent light-emitting elements.

A display panel is provided in an embodiment of the present disclosure, which includes a substrate, a first electrode layer, a pixel definition layer, a first-type carrier layer, a light-emitting layer, a second-type carrier layer, a second electrode layer, and a leakage barrier control line.

The first electrode layer is disposed on one side of the substrate and includes a plurality of discrete first electrodes.

The pixel definition layer with a plurality of opening structures is disposed on one side of the first electrode layer facing away from the substrate, and the plurality of opening structures expose part of the plurality of first electrodes.

The leakage barrier control line is then disposed on the pixel definition layer.

The first-type carrier layer, then is the light-emitting layer, the second-type carrier layer, and finally the second electrode layer, are sequentially deposit on the display panel as formed above.

The first-type carrier layer is a hole-conduction layer, and the second-type carrier layer is an electron-conduction layer; or vice versa, the first-type carrier layer is an electron-conduction layer, and the second-type carrier layer is a hole-conduction layer.

According to the display panel provided in the embodiment of the present disclosure, the leakage barrier control line will generate a potential barrier inside the first-type carrier layer that hinders a lateral flow of the first-type carrier, so that the lateral leakage current between adjacent sub-pixel is effectively under controlled.

DETAILED DESCRIPTION

Figure 1:
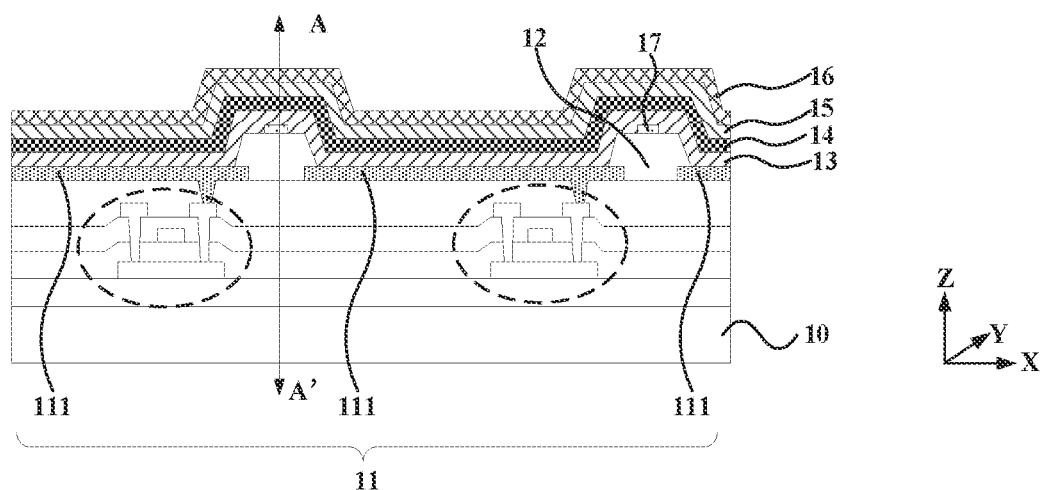
FIG. 1 shows structures of a display panel according to an embodiment of the present disclosure.

Hereinafter the present disclosure is further described in detail in conjunction with the drawings and embodiments. It is to be understood that the embodiments set forth below are intended to illustrate and not to limit the present disclosure. Additionally, it is to be noted that for ease of description, only part, not all, of the structures related to the present disclosure are illustrated in the drawings.

FIG. 1 shows structures of a display panel according to an embodiment of the present disclosure. Referring to FIG. 1, the display panel includes a substrate 10, a first electrode layer 11, a pixel definition layer 12, a first-type carrier layer 13, a light-emitting layer 14, a second-type carrier layer 15, a second electrode layer 16 and a leakage barrier control line 17.

The first electrode layer 11 is disposed on one side of the substrate 10 and patterned to form a plurality of discrete first electrodes 111. The pixel definition layer 12 is disposed on the side of the first electrode layer 11. The pixel definition layer 12 is provided with a plurality of opening structures 121, and the opening structure 121 exposes part of the first electrode 111. The first-type carrier layer 13 is disposed on the pixel definition layer 12 and the first electrodes 111. The light-emitting layer 14 is disposed on the first-type carrier layer 13 and the second-type carrier layer 15 is disposed on the light-emitting layer 14. Finally the second electrode layer 16 is disposed on the second-type carrier layer 15. Five layers stacked in the opening portion of the pixel definition layer, including the first electrode layer 11, the first-type carrier layer 13, the light-emitting layer 14, the second-type carrier layer 15, and the second electrode layer 16, form a pixelated white OLED, segregated only by the patterned first electrode 11. Benefiting from this arrangement, manufacturing a display on a small substrate or manufacturing a display with extremely high pixel density become feasible, since mechanical shadow masks are no longer needed during OLED depositions. Instead, a color filter array in high pixel density made by lithography process, will be disposed on the white OLED array.

In the embodiment of the present disclosure, the leakage barrier control line 17 disposed at the interface of the pixel definition layer 12 and the first-type carrier layer 13 generates, at the interface and in the bulk of the first-type carrier layer 13, a potential barrier that hinders lateral flow of the first-type carrier. Therefore, lateral leakage current between two adjacent light emitting elements are reduced. The material of the leakage barrier control line is carefully selected in terms of working function difference between the first-type carrier layer and the leakage barrier control line, in order to form potential barrier. The material selection is also based on the conduction type of the first-type carrier layer, that a positive potential barrier is needed when the first-type carrier layer is in hole-conduction mode, and vice versa.

Several specific implementations of the leakage barrier control line are provided below. For example, the leakage barrier control line and the first-type carrier layer may form a Schottky junction or a heterojunction, where an energy band bending may occur so as to form a potential barrier to block lateral carrier flow.

Figure 2:
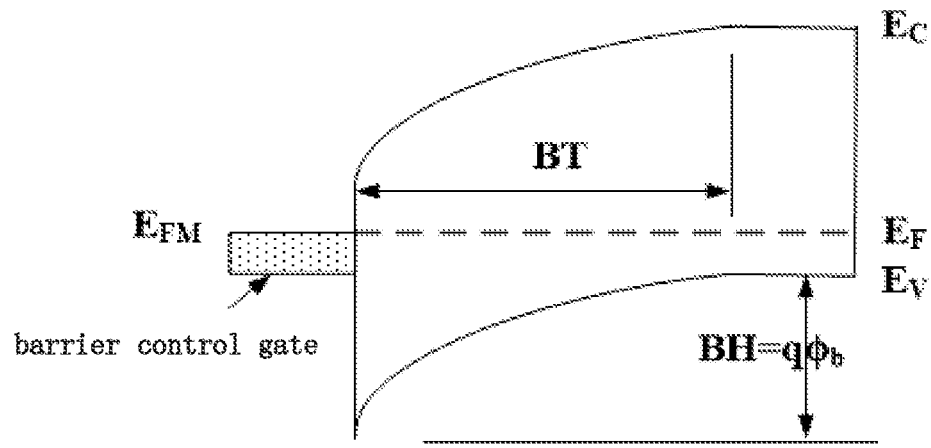
FIG. 2 illustrates an energy band diagram at a contact interface of a leakage barrier control line and a first-type carrier layer along a line AA' as shown in FIG. 1.
Figure 3:
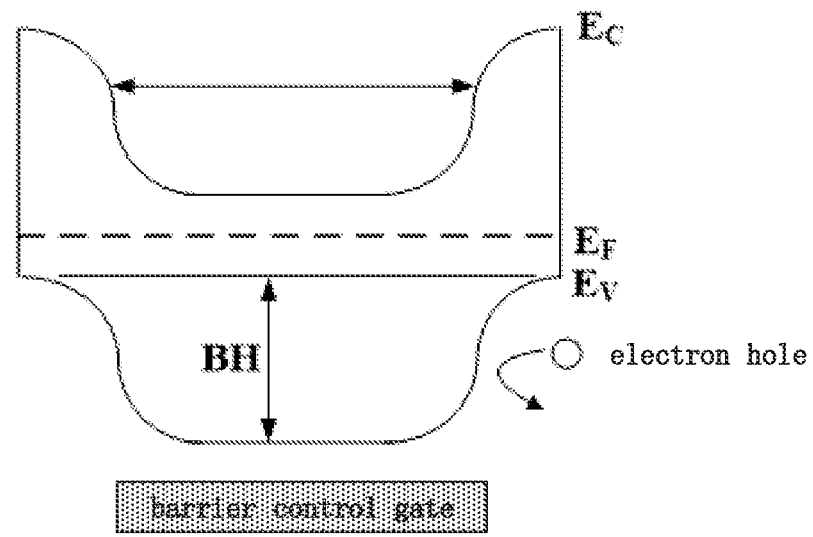
FIG. 3 illustrates an energy band diagram of a first-type carrier layer in a direction perpendicular to the AA' line and in parallel to the X-axis as shown in FIG. 1.

In the display panel shown in FIG. 1, if the first-type carrier layer is in hole-conduction mode, the leakage barrier control line may be made of a metal material with a work function less than an electron affinity of the first-type carrier layer. FIG. 2 illustrates an energy band diagram at a contact interface of a leakage barrier control line and the first-type carrier layer along a AA' line shown in FIG. 1. FIG. 3 illustrates an energy band diagram in the bulk of the first-type carrier layer in a direction perpendicular to the AA' line and in parallel to X-axis shown in FIG. 1.

When the first-type carrier layer is made of P-type semiconductor, it is in hole-conduction mode. When the leakage barrier control line is in an electrically floating status, and a thermal equilibrium is reached with the first-type carrier layer, the potential level of the leakage barrier control line and the Fermi level of the first-type carrier layer approach a same potential level as illustrated in FIG. 2. In FIGS. 2 and 3, $E_{FM}$ represents a potential level of the leakage barrier control line at thermal equilibrium. For the P-type semiconductor i.e. the first-type carrier layer, $E_C$ represents its conduction band level, of $E_V$ represents its valence band level, and $E_F$ represents its Fermi energy level. The difference between the work function of the control gate and electron affinity of the P-type semiconductor becomes the maximum potential barrier at the interface with a barrier height BH equal to $q\phi_b$. This energy band bending extends into the bulk of the P-type semiconductor and reaches a depth BT, which is equivalent to a hole barrier thickness. The hole barrier thickness BT is also dependent on a carrier density in the P-type semiconductor, that a lower carrier density, results in a thicker hole barrier.

In one embodiment, a concave hole barrier for blocking the lateral transmission of holes exist in the hole conduction layer. The maximum barrier BH is achieved at the interface between the leakage barrier control line and the hole conduction layer. The deeper in the direction away from the leakage barrier control line, the lower the hole BH. When the difference between the work function of the leakage barrier control line and the electron affinity of the hole conduction layer is large enough, or the hole conduction layer is thin enough, a hole barrier preventing lateral diffusion of holes is formed throughout the hole conduction layer, thereby effectively hindering current diffusion between adjacent light-emitting elements. Referring to FIG. 3, the hole barrier width BW is approximately equal to the width (width along the X direction in FIG. 1) of the leakage barrier control line.

In order to raise the hole barrier, it is necessary to select a metal material with a smaller work function relative to the hole conduction layer, e.g., alkali metals such as Na, K, Ca, Cs, Li, etc. These metals are generally chemically active metals and are prone to oxidation and chemical reactions. Alloys, oxides or nitrides of these active metals, or organic or inorganic compounds containing these active metals are more suitable for the leakage barrier control line of the present disclosure. In practical application, relatively stable metal materials such as Cr, Mo, Al, Sn and other metals or alloys thereof are used. Although the work functions of these relatively stable metal materials are not as low as that of alkali metals, the hole barriers can be still generated.

In addition, the leakage barrier control line may also be made of an N-type semiconductor with a smaller electron affinity to be in contact with the hole conduction layer to form a heterojunction. A barrier for hindering the lateral diffusion of holes at the interface of two semiconductors can also be formed by using a barrier forming mechanism based on the heterojunction. After the N-type semiconductor is in contact with the hole conduction layer, a thermal equilibrium is reached. For example, the leakage barrier control line may have the electron affinity less than the electron affinity of the hole conduction layer, so that a hole barrier having sufficient height is formed in the hole conduction layer to hinder the flow of holes.

Figure 4:
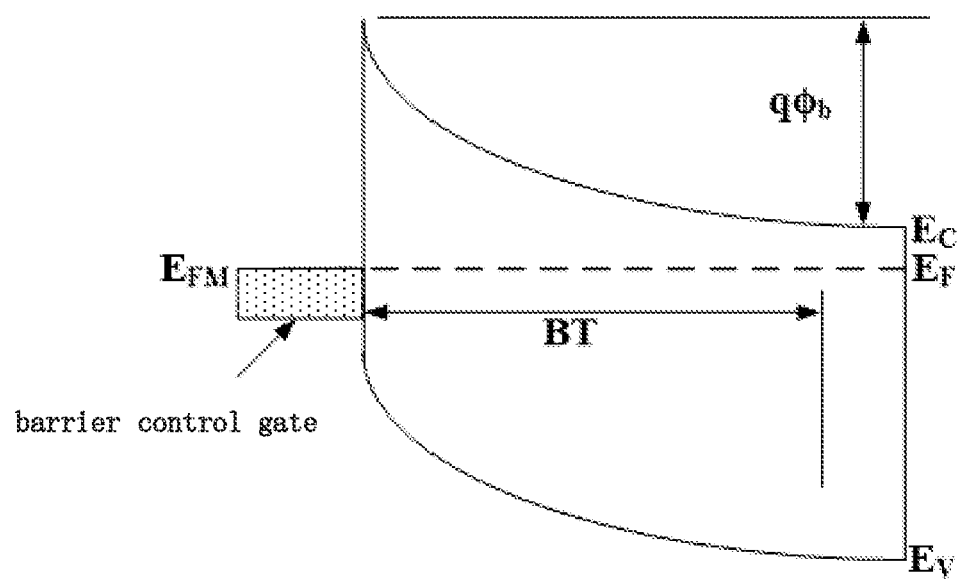
FIG. 4 illustrates an energy band diagram at the contact interface of the leakage barrier control line and the first-type carrier layer along the AA' line as shown in FIG. 1.
Figure 5:
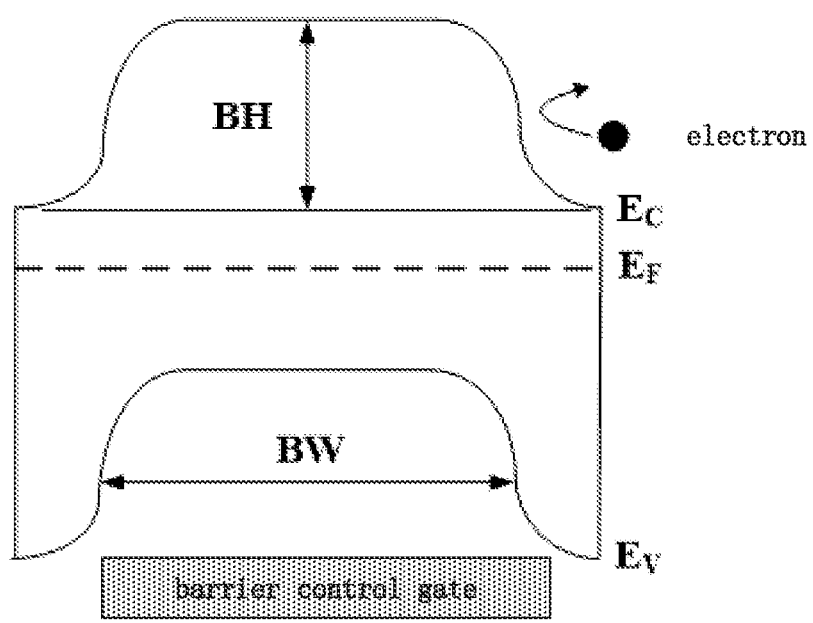
FIG. 5 illustrates an energy band diagram of a first-type carrier layer in a direction perpendicular to the AA' line and in parallel to the X-axis as shown in FIG. 1.

Optionally, in the display panel of FIG. 1, if the first-type carrier layer is the electron-conduction layer and the second-type carrier layer is the hole conduction layer, the leakage barrier control line may be configured to be made of a metal material with a work function greater than an electron affinity of the first-type carrier layer. FIG. 4 illustrates an energy band diagram of a contact interface of a leakage barrier control line and a first-type carrier layer along the AA' line as shown in FIG. 1. FIG. 5 illustrates an energy band diagram of a first-type carrier layer in a direction perpendicular to the AA' and in parallel to the X-axis as shown in FIG. 1. As shown in FIGS. 4 and 5, the first-type carrier layer is the electron-conduction layer, the second-type carrier layer is the hole conduction layer, the leakage barrier control line includes the metal material with the work function greater than the electron affinity of the first-type carrier layer. Since the first-type carrier layer is made of N-type semiconductor, it is in the electron-conduction mode. When a leakage barrier control line made of the metal material is in contact with the N-type electron-conduction layer, if the leakage barrier control line is in an electrically floating status and a thermal equilibrium is reached with the first-type carrier layer, the potential level of the leakage barrier control line and the Fermi level of the first-type carrier layer approach a same potential level as illustrated. This energy band corresponds to the bending shape of the energy band of the AA' line in the Z-axis direction in FIG. 1. The difference between the work function of the control gate and electron affinity of the N-type semiconductor becomes the minimum potential barrier at the interface with electron barrier height BH is equal to $q\phi_b$. This energy band bending extends into the bulk of the N-type semiconductor and reaches a depth BT, which equivalent to the electron barrier thickness. The electron barrier thickness BT is dependent on a carrier density in the N-type semiconductor. A lower the carrier density results in a thicker electron barrier. As shown in FIGS. 4 and 5, since the electron-conduction layer is in direct contact with the leakage barrier control line in this embodiment, the width BW of the barrier is approximately equal to the width (width along the X direction in FIG. 1) of the leakage barrier control line.

If a leakage barrier control line exists below the electron-conduction layer, a convex electron barrier for blocking the lateral transmission of holes will exist in the electron-conduction layer. The maximum barrier height BH is achieved at the interface between the leakage barrier control line and the electron-conduction layer. The deeper in the direction away from the leakage barrier control line, the lower the height of the barrier in the electron-conduction layer. When the difference between the work function of the leakage barrier control line and the electron affinity of the electron-conduction layer is large enough, or the electron-conduction layer is thin enough, a barrier preventing lateral diffusion of electrons is formed throughout the thickness of the electron-conduction layer, thereby effectively hindering current diffusion between adjacent light-emitting elements.

In order to raise the electron barrier shown in FIGS. 4 and 5, a metal material with a larger work function or a conductive metal oxide may be selected relative to the electron-conduction layer. Such materials include metals such as gold Au, Cu, Co, Ir, Ni, Ge, Pd, Pt, or alloys, oxides or nitrides thereof, or commonly used transparent electrode materials such as ITO, SnO2, etc.

In addition, the leakage barrier control line may also be made of a P-type semiconductor with a larger electron affinity to be in contact with the electron-conduction layer to form a heterojunction. A barrier for hindering the lateral diffusion of electrons at the interface of two semiconductors can also be formed by using a barrier forming mechanism based on the heterojunction. After the P-type semiconductor material is in contact with the electron-conduction layer, a thermal equilibrium is reached. For example, the leakage barrier control line may have an electron affinity greater than the electron affinity of the electron-conduction layer, so that an electron barrier with enough height is formed in the electron-conduction layer to hinder the flow of electrons.

Figure 6:
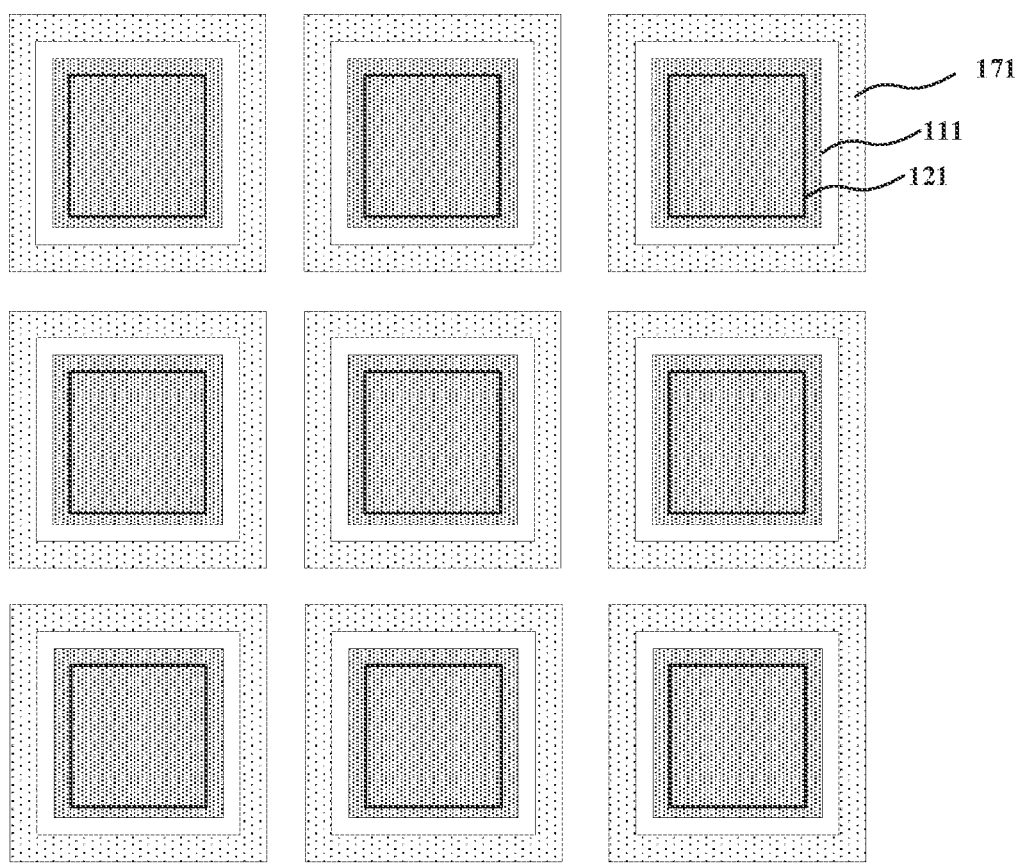
FIG. 6 shows atop view of a leakage barrier control line according to an embodiment of the present disclosure.

Optionally, the leakage barrier control line includes a plurality of leakage barrier control branches, which are insulated from each other. In order to enhance the blocking effect on lateral current diffusion, one or more leakage barrier control branches may also be disposed between two adjacent light-emitting elements, and the leakage barrier control branches may be connected to each other or independent of each other. FIG. 6 shows a top view of a leakage barrier control line according to an embodiment of the present disclosure. As shown in FIG. 6, the leakage barrier control line includes a plurality of leakage barrier control branches 171 which are insulated from each other. This configuration may avoid abnormal display in all subpixel regions of the entire display panel due to electrical connection of leakage barrier control lines corresponding to all pixels when a short circuit occurs in one subpixel region of the display panel.

Optionally, still referring to FIG. 6, at least one leakage barrier control branch (two leakage barrier control branches are exemplarily disposed in FIG. 6) surrounds one opening structure, and the leakage barrier control branch has a ring shape. The opening structure 121 of the pixel definition layer 12 exposes part of the first electrode 111. The opening structure 121 defines a practical light-emitting area of the light-emitting element.

Since carrier diffusion attenuates exponentially with the increase of barrier width, a plurality of leakage barrier control branches are disposed between two adjacent light-emitting elements, which can increase the barrier width and further significantly reduce lateral diffusion of first-type carriers. Due to the limitation of a photolithography process and the requirement of uniformity, a gap between adjacent two leakage barrier control branches should not be too small so as to prevent the leakage barrier control branches from being unable to be separated by the photolithography process. If a metal wet etching process is used, the gap may be set above 0.5 microns. If a metal or semiconductor dry etching process is used, the gap may be set above 0.1 micron. A finer lithography process enables more leakage barrier control branches to be placed between adjacent light-emitting elements, thus controlling the lateral diffusion of carriers more effectively.

Figure 7:
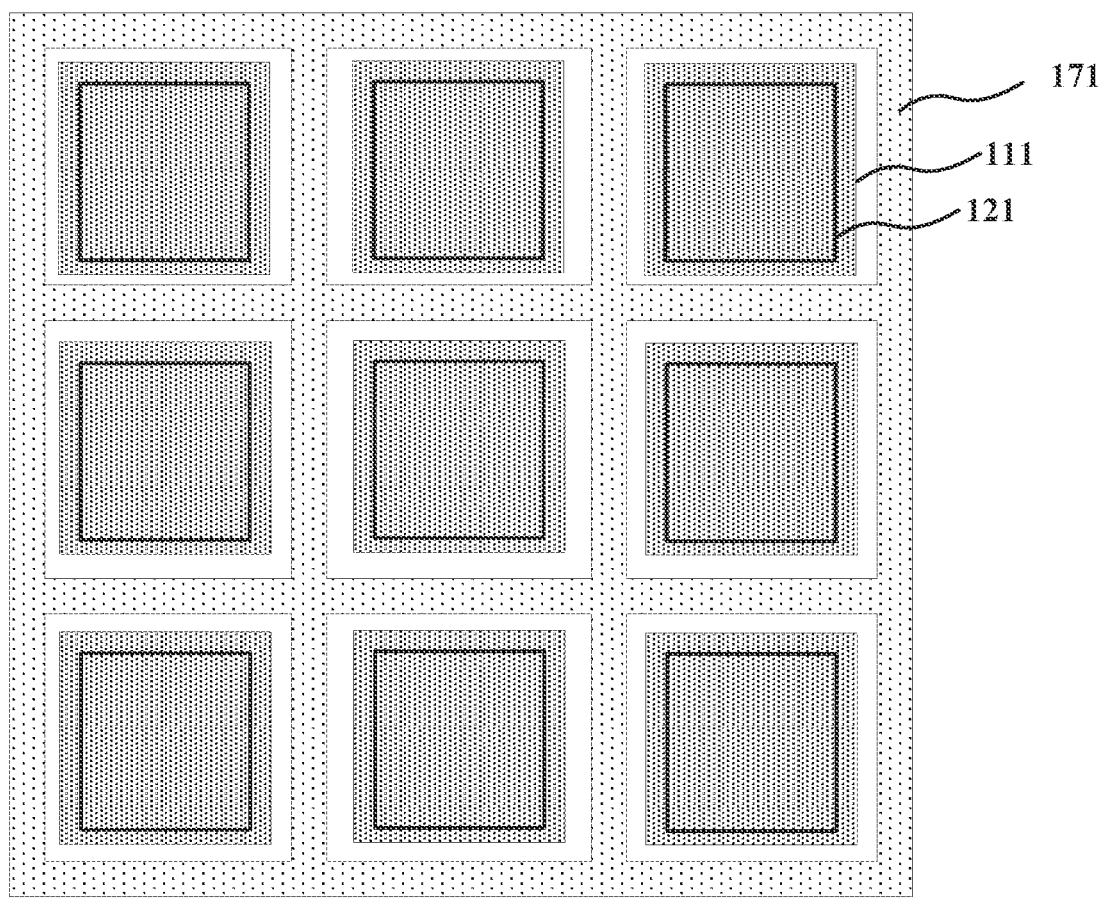
FIG. 7 shows a top view of a leakage barrier control line according to another embodiment of the present disclosure.

Optionally, in the embodiment of the present disclosure, leakage barrier control branches may also be electrically connected to each other. FIG. 7 shows a top view of another leakage barrier control line according to an embodiment of the present disclosure. As shown in FIG. 7, all leakage barrier control branches 171 are connected together, and a vertical projection of the leakage barrier control line on the substrate may also be set to be in a grid shape. The periphery of each opening structure is surrounded by a leakage barrier control line. When the leakage barrier control line is set in this manner, the process is the simplest when the leakage barrier control line is formed by means of etching. In addition, the entire leakage barrier control line is at the same potential under the thermal equilibrium, which can prevent electrostatic charges from being accumulated in a local region and facilitate the export of electrostatic charges accumulated in the display panel due to static electricity, or prevent the electrostatic charges from being accumulated in the local region.

Since the mechanism for the leakage barrier control line to form the first-type carrier barrier for blocking the movement of the first-type carrier is based on the spatial energy band distribution rather than the geometric size, the leakage barrier control line may be very thin. For example, the thickness is greater than 20 nm, thus bringing greater redundancy and low cost to the process. Moreover, for the first-type carrier layer, the light-emitting layer, the second-type carrier layer and the like formed on the leakage barrier control line by means of evaporation or the like, due to the thinner leakage barrier control line, the first-type carrier layer, the light-emitting layer, the second-type carrier layer are relatively flatter, so that the short circuit or open circuit problems of the second electrode can be avoided, and the light-emitting uniformity of the entire display panel can be optimized.

The probability of a carrier penetrating the barrier decreases sharply with the increase of the thickness of the barrier, so that the width BW of the leakage barrier control line (the width of the leakage barrier control line in the X direction in FIG. 1) may be set to be greater than 100 nm. When the leakage barrier control line is made of metal material, the width BW of the leakage barrier control line is generally set to be less than the gap between the first electrodes of adjacent light-emitting elements in order to avoid short circuit with the electrode of the light-emitting element.

Optionally, a plurality of leakage barrier control branches 171 are disposed between two adjacent opening structures (two leakage barrier control branches are exemplarily disposed between adjacent opening structures in FIG. 6), and barriers formed by the leakage barrier control branches between the adjacent opening structures are staggered. For the two leakage barrier control branches disposed between the adjacent opening structures, one of the two leakage barrier control branches forms an electron barrier, and the other forms a hole barrier. The two leakage barrier control branches disposed between the adjacent opening structures form barriers of opposite types, so that the barriers formed between the adjacent light-emitting elements for blocking the lateral transmission of carriers between the light-emitting elements are steeper, avoiding the lateral transmission of carriers between the adjacent light-emitting elements. In other embodiments, if three or more leakage barrier control branches are disposed between the adjacent opening structures, the barriers formed by the leakage barrier control branches between the adjacent opening structures may be arranged in type to be an electron barrier, a hole barrier, an electron barrier, a hole barrier, . . . , or a hole barrier, an electron barrier, a hole barrier, an electron barrier, . . . .

Optionally, adjacent leakage barrier control branches among the leakage barrier control branches between the adjacent opening structures are made of different materials. In this embodiment, in order to facilitate the implementation of the photolithography process, adjacent leakage barrier control branches among the leakage barrier control branches disposed between the adjacent opening structures are made of different materials, so that there is a wider range of etching selection ratios in the selection of etching solution and the control of process.

Optionally, for the two adjacent leakage barrier control branches among the leakage barrier control branches disposed between the adjacent opening structures, one may be made of a metal material, and the other may be made of a semiconductor material.

Optionally, if no insulating layer exists between the leakage barrier control line and the first-type carrier layer, the leakage barrier control line may be floated.

In addition, no matter whether an insulating layer exists between the leakage barrier control line and the first-type carrier layer, the leakage barrier control line can be electrically connected to a potential input terminal, and the potential is provided to the leakage barrier control line through the potential input terminal. The potential inputted from the potential input terminal may be a fixed potential or a variable potential.

Figure 8:
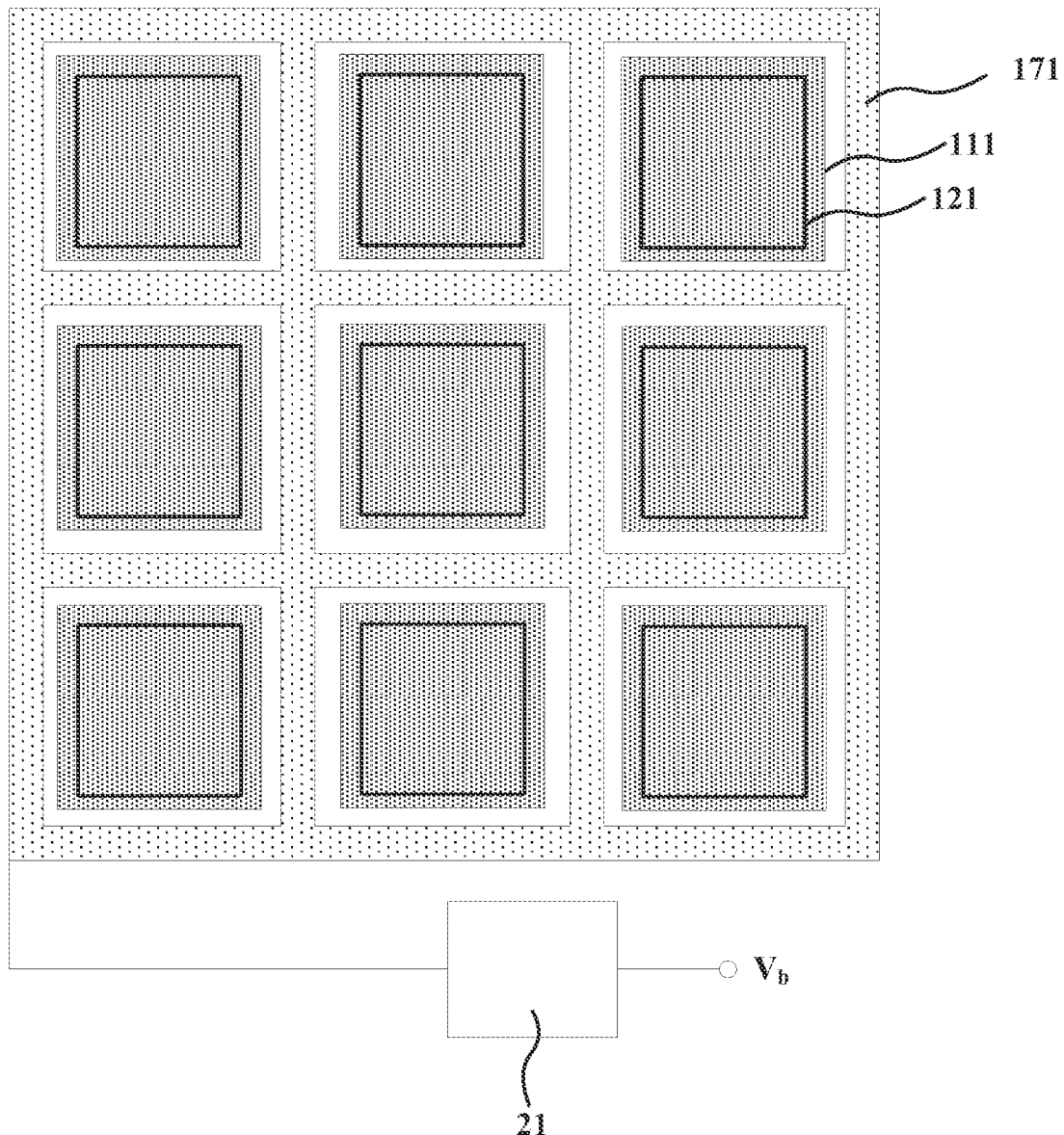
FIG. 8 shows a top view of a display panel according to another embodiment of the present disclosure.
Figure 9:
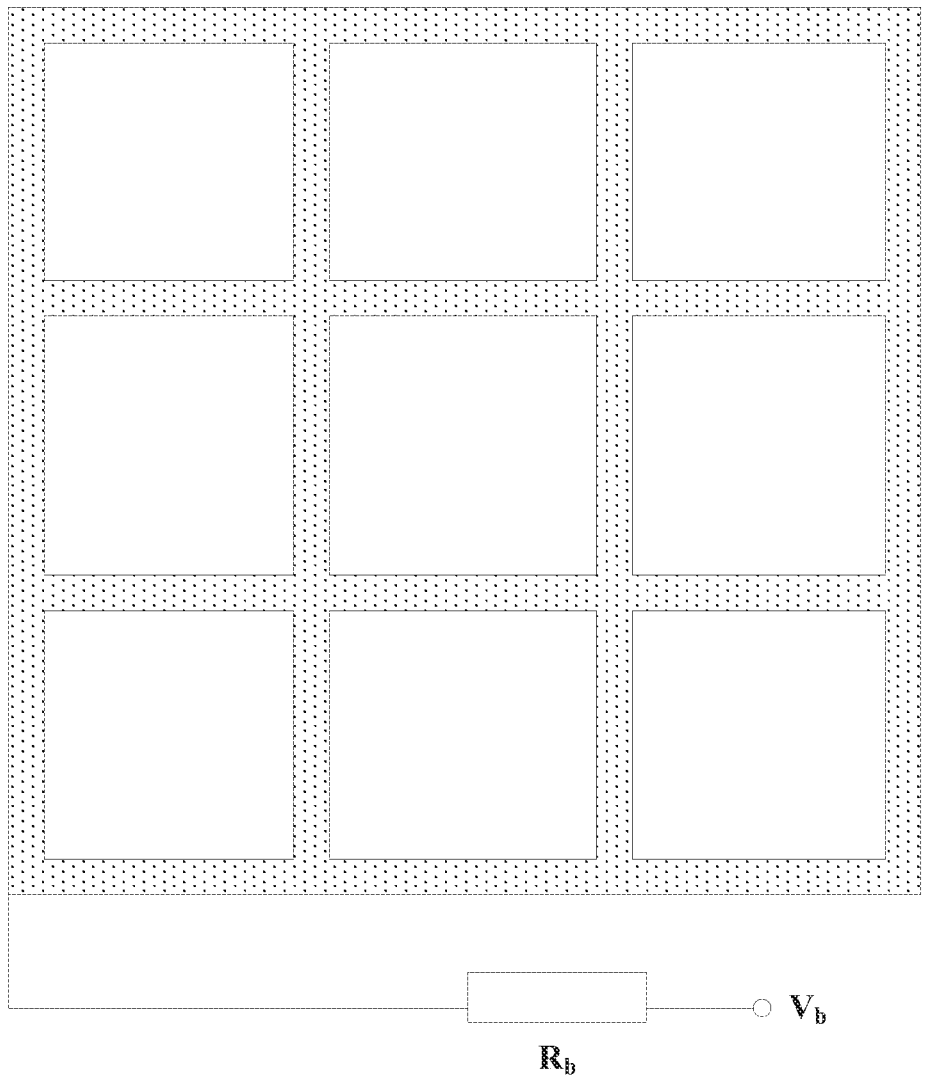
FIGS. 9 to 13 illustrate several specific implementations of an external bias circuit of the bias gate network configured by passive devices according to an embodiment of the present disclosure.
Figure 10:
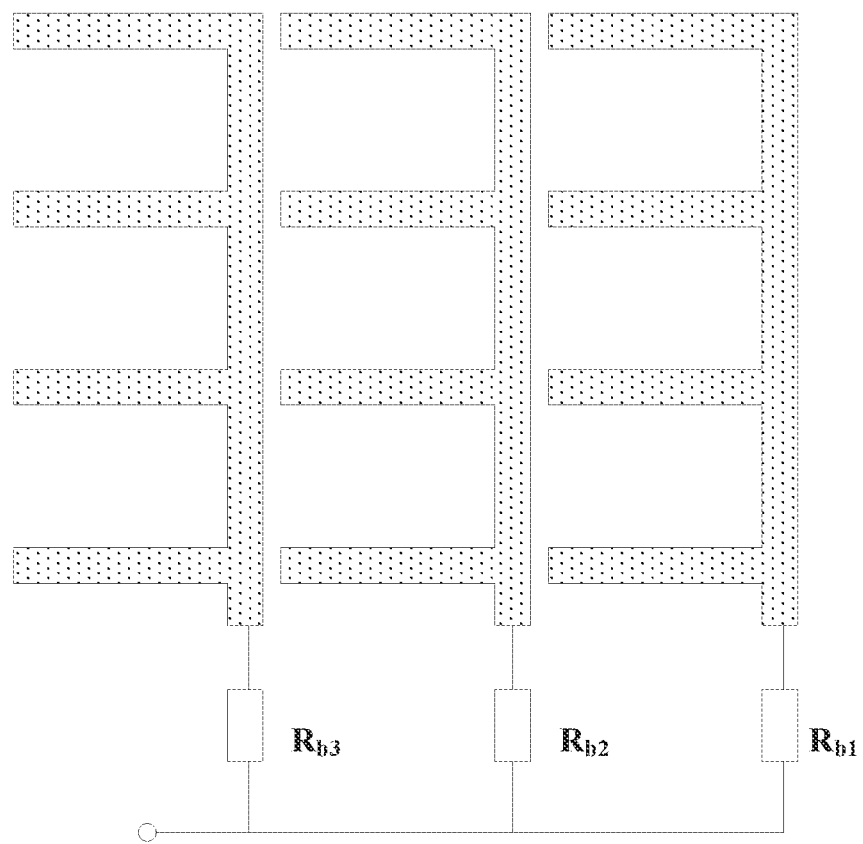
Figure 11:
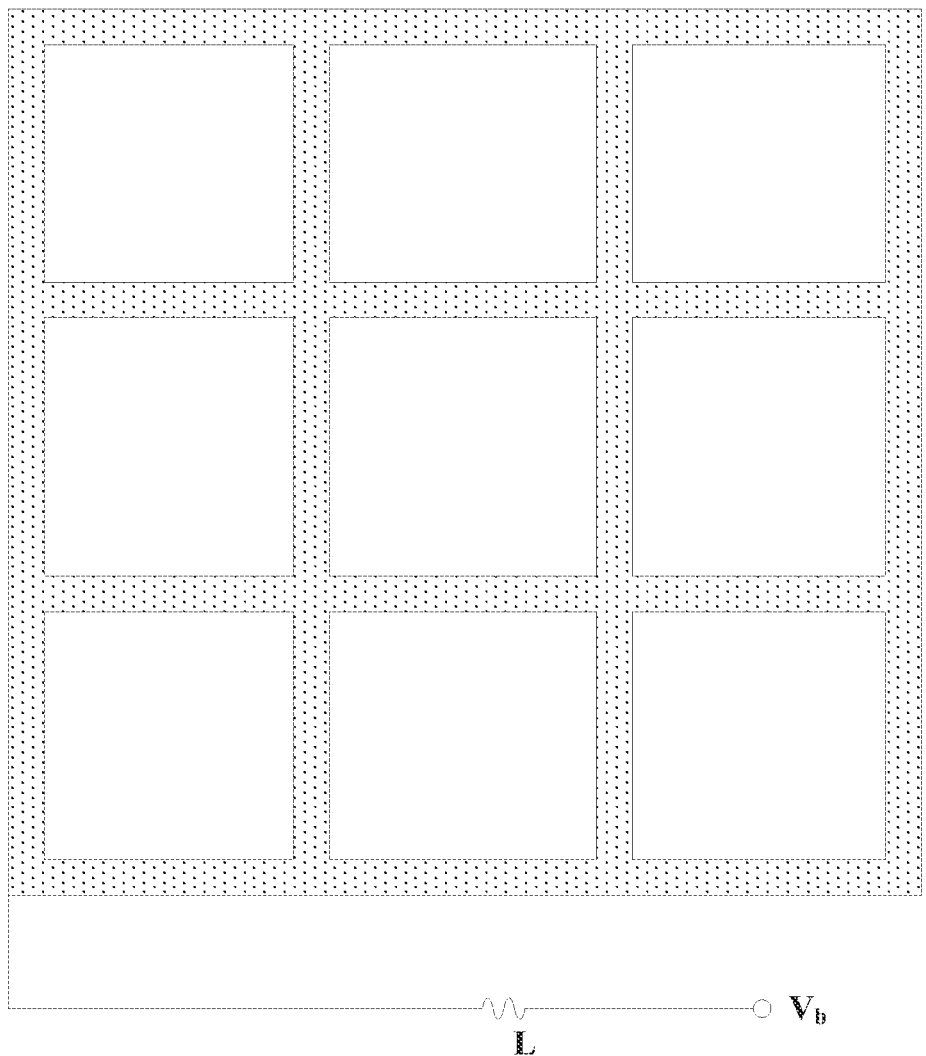

FIG. 8 shows a top view of another display panel according to an embodiment of the present disclosure. As shown in FIG. 8, the display panel provided in the embodiment of the present disclosure may further include an impedance circuit 21 through which the leakage barrier control line is electrically connected to the potential input terminal Vb. The impedance circuit 21 can buffer when the transient voltage of external static electricity is large, so as to prevent electrostatic damage to the display panel.

Figure 12:
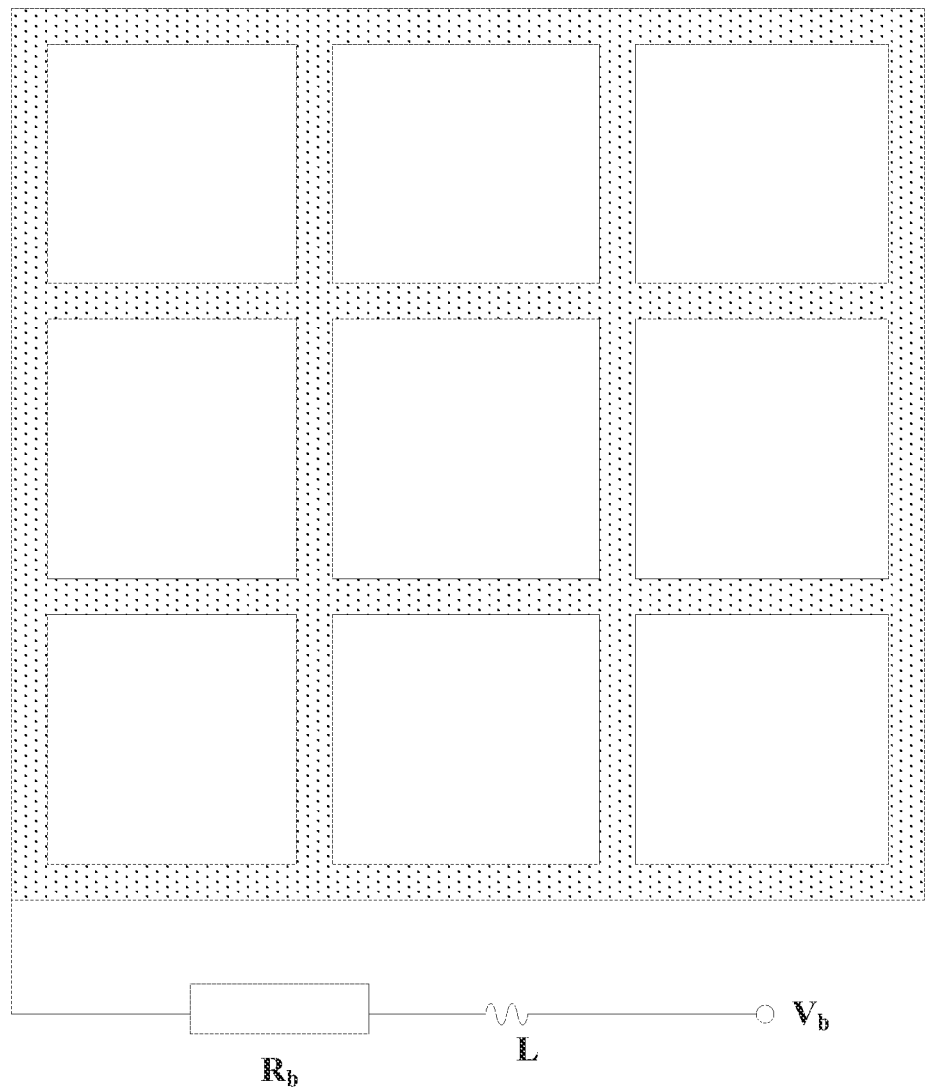
Figure 13:
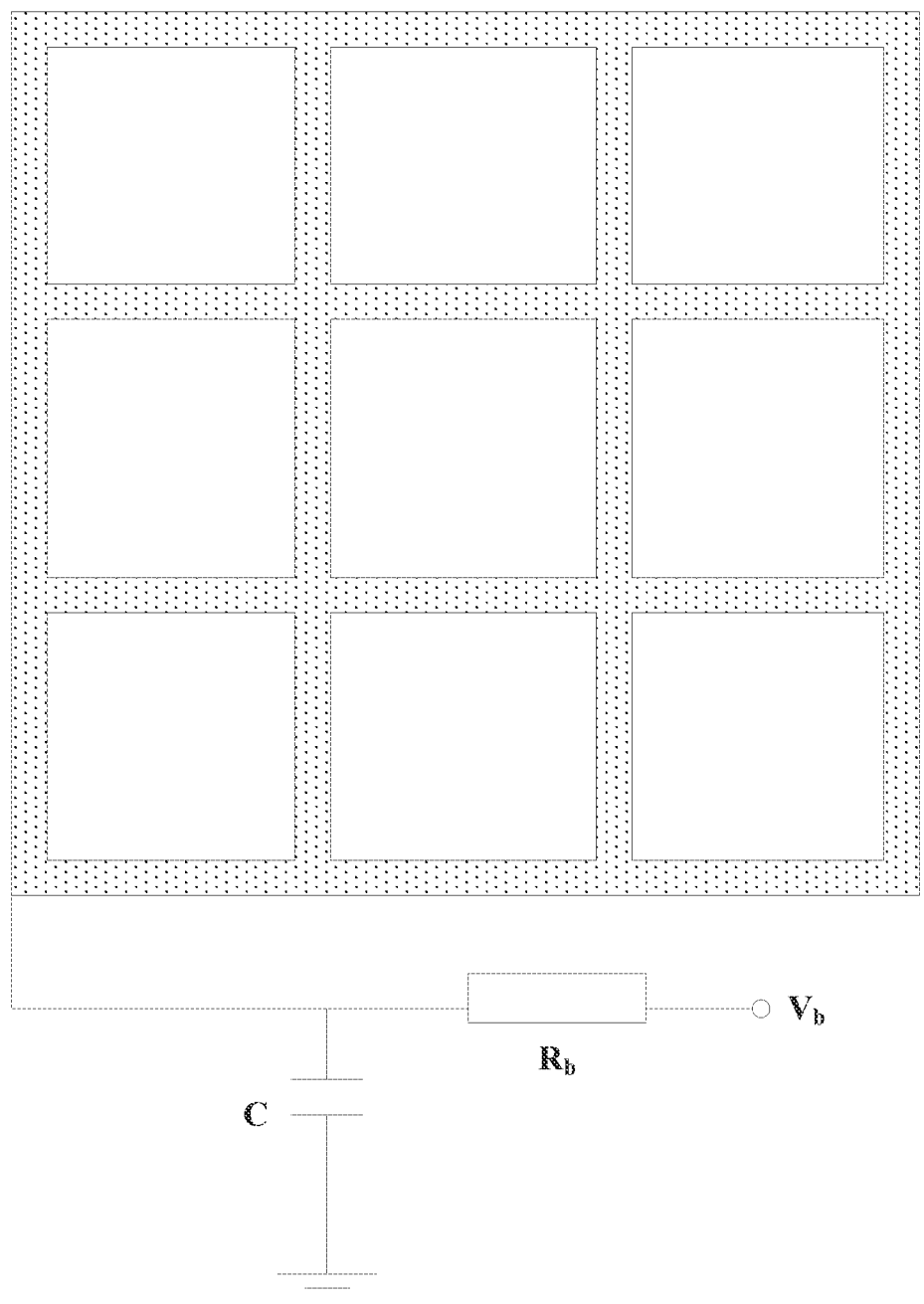
Figure 14:
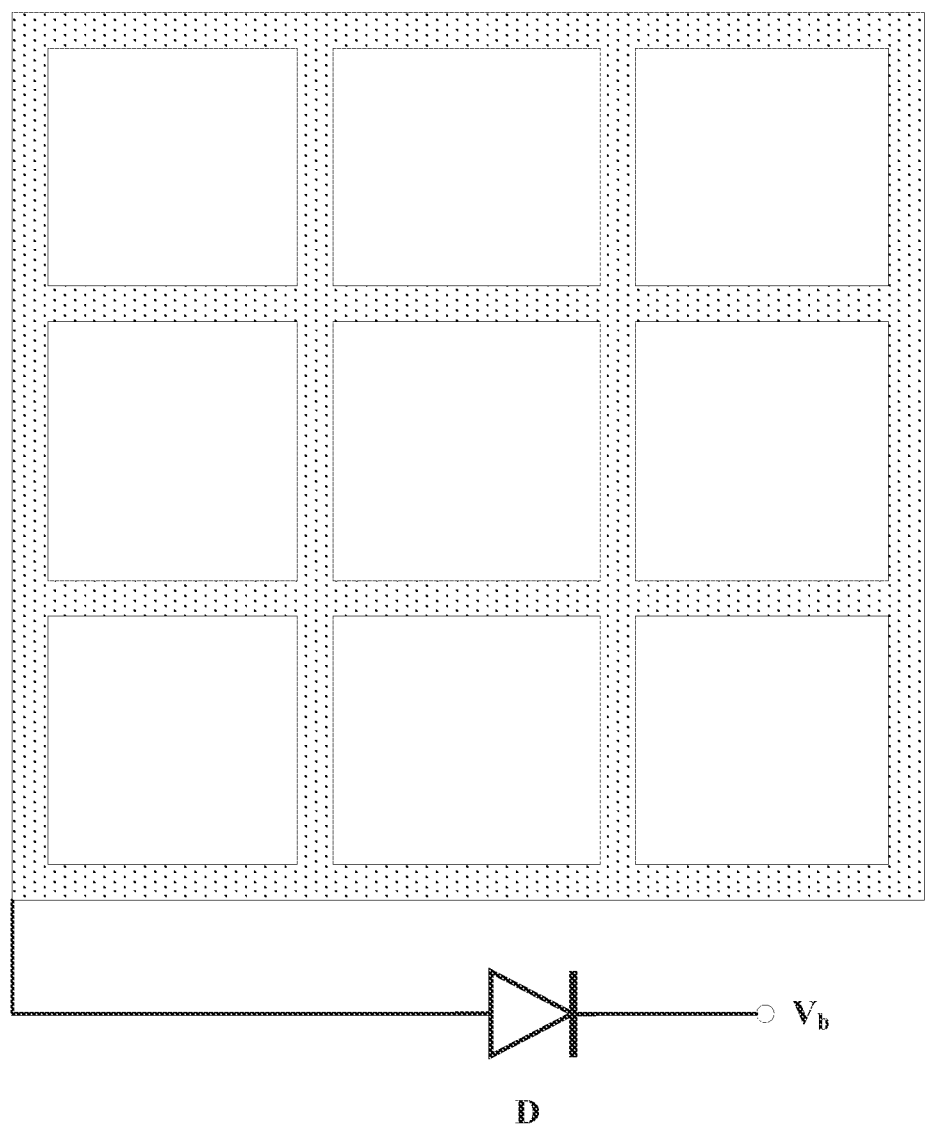
FIGS. 14 to 17 illustrate several specific implementations of an external bias circuit of the bias gate network configured by active devices according to an embodiment of the present disclosure.
Figure 15:
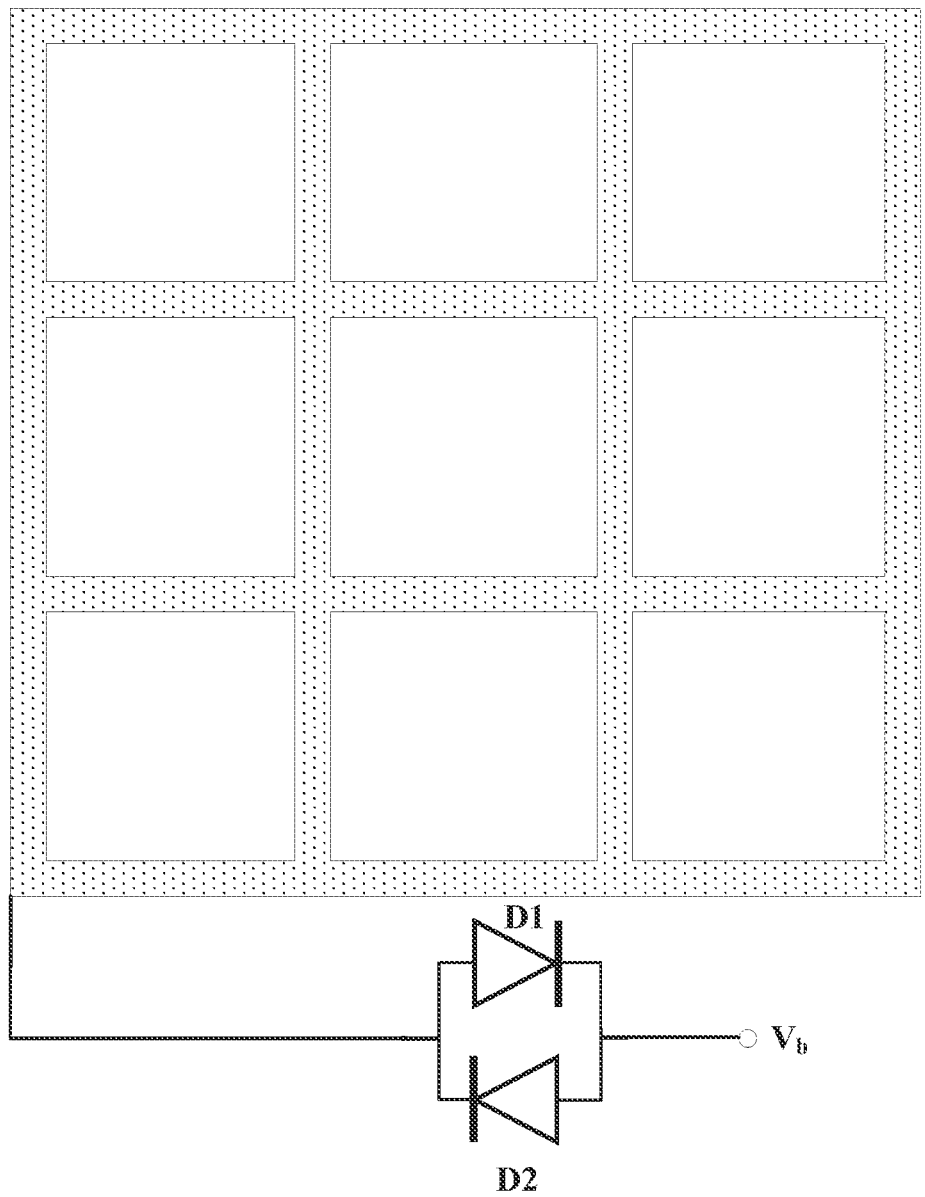
Figure 16:
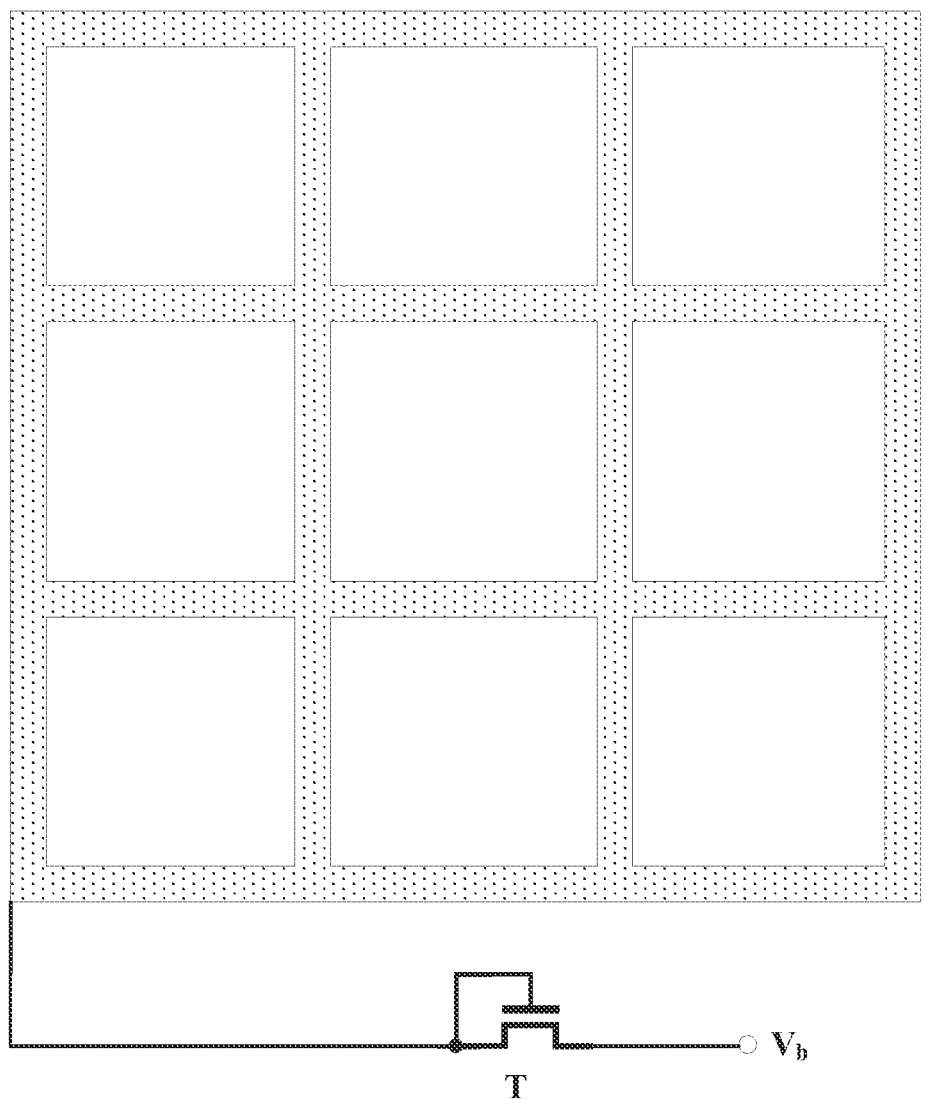

It is to be noted that the impedance circuit may be a circuit having at least one of components such as a resistor, a capacitor, and an inductor. The specific circuit structure of the impedance circuit is not limited in the embodiment of the present disclosure. FIGS. 9 to 13 illustrate several specific implementations an external bias circuit of the bias gate network configured by passive devices. As shown in FIG. 12, the impedance circuit may include resistor Rb. As shown in FIG. 13, the impedance circuit includes a plurality of resistors $R_{bi}$, the leakage barrier control branches corresponding to the same column of light-emitting elements are electrically connected, the plurality of resistors $R_{bi}$ are electrically connected to a plurality of columns of leakage barrier control branches in a one-to-one correspondence, and i is a positive integer. As shown in FIG. 14, the impedance circuit includes inductor L. As shown in FIG. 15, the impedance circuit includes resistor Rb and inductor L, and resistor Rb and inductor L are connected in series. As shown in FIG. 16, the impedance circuit includes resistor Rb and capacitor C, one end of capacitor C is electrically connected to resistor Rb, and the other end of capacitor C is connected to the ground.

It is to be noted that resistor Rb in the above embodiment may be formed of an electrode material having a certain resistance, such as ITO, or may be formed by using a semiconductor thin film, such as polysilicon or amorphous silicon. Resistor Rb may be formed in the same process by using the same material as the film in the display panel, which is not limited in the embodiment of the present disclosure.

Figure 17:
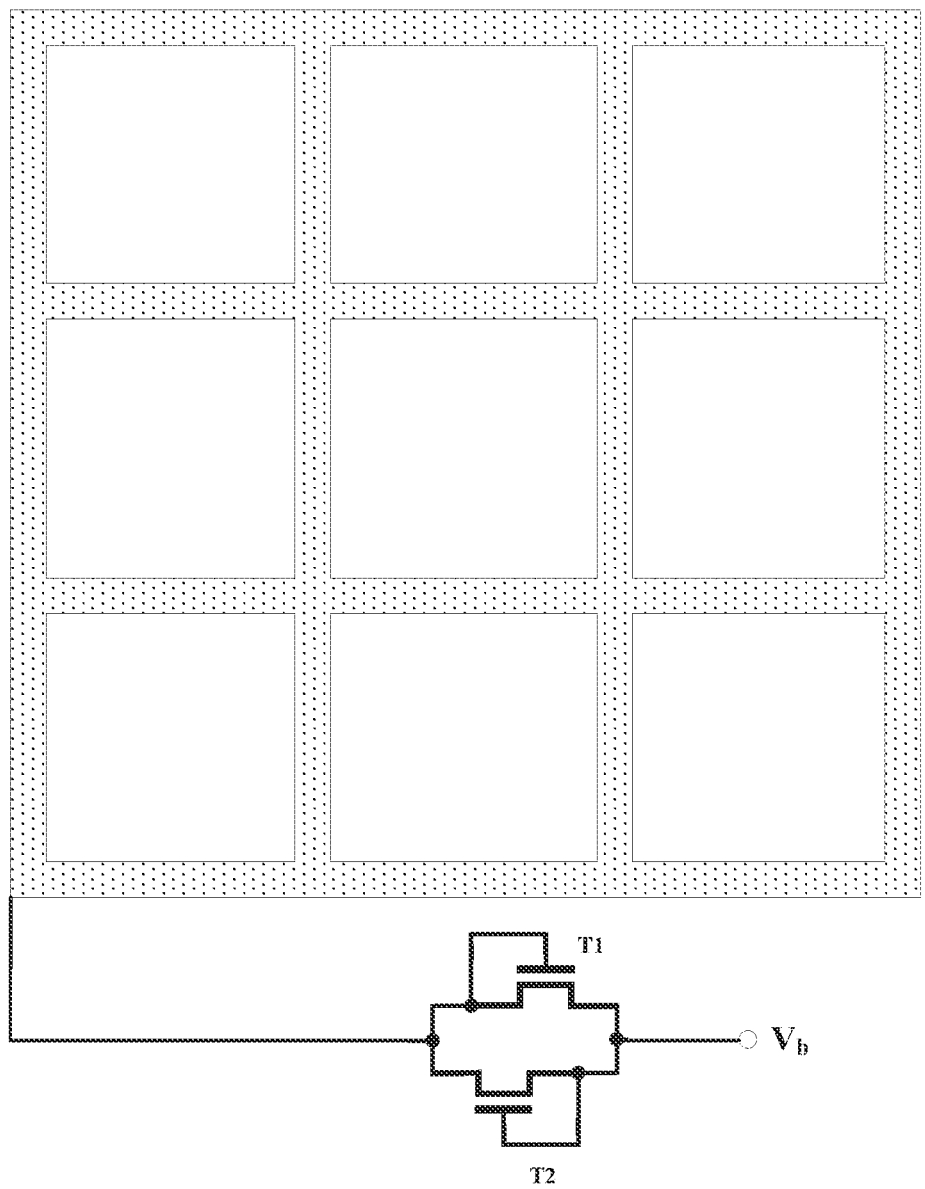

Optionally, the display panel provided in the embodiment of the present disclosure further includes an electrostatic discharge circuit, where the leakage barrier control line is electrically connected to the electrostatic discharge circuit. When electrostatic charges are accumulated on the leakage barrier control line, the electrostatic charges can be discharged through the electrostatic discharge circuit to avoid impact on the display effect caused by electrostatic damage to the display panel. It is to be noted that the electrostatic discharge circuit may include at least one diode or triode. The specific circuit structure of the electrostatic discharge circuit is not limited in the embodiment of the present disclosure. FIGS. 14 to 17 illustrate several specific implementations of an external bias circuit of the bias gate network configured by active devices. As shown in FIG. 17, the electrostatic discharge circuit includes diode D. As shown in FIG. 18, the electrostatic discharge circuit includes diodes D1 and D2. Diode D1 and diode D2 are connected in parallel with opposite conduction directions. As shown in FIG. 19, the electrostatic discharge circuit includes transistor T, and the input terminal and the control terminal of transistor T are electrically connected. As shown in FIG. 20, the electrostatic discharge circuit includes transistor T1 and transistor T2, and transistor T1 and transistor T2 are connected in parallel with opposite conduction directions. The input terminal and the control terminal of transistor T1 are electrically connected. The input terminal and the control terminal of transistor T2 are electrically connected.

The display panel provided in the embodiment of the present disclosure further includes a plurality of scanning lines, and the vertical projection of the scanning lines on the substrate is located in the vertical projection of the leakage barrier control line on the substrate. The scanning signal on the scanning line will cause crosstalk to the electrode (first electrode or second electrode) above the scanning line. Therefore, in the embodiment of the present disclosure, the vertical projection of the scanning lines on the substrate is configured to be located in the vertical projection of the leakage barrier control line on the substrate, and the leakage barrier control line can effectively shield the impact of the signal on the scanning line on the signal on the electrode overlapping with the scanning line.

The above detailed descriptions of the embodiments of the present invention set forth preferred modes contemplated by the inventors for carrying out the present invention at the time of filing this application, and are provided by way of examples and not as limitations. Accordingly, various modifications and variations obvious to a person of ordinary skill in the art to which it pertains are deemed to lie within the scope and spirit of the present invention as set forth in the following claims.

What is claimed is:

1. A display panel, comprising:
    a substrate;
    a first electrode layer disposed on one side of the substrate, wherein the first electrode layer comprises a plurality of discrete first electrodes;
    a pixel definition layer with a plurality of opening structures disposed on one side of the first electrode layer facing away from the substrate, wherein the plurality of opening structures exposes part of the plurality of first electrodes;
    a first-type carrier layer disposed on sides of the pixel definition layer and the plurality of first electrodes facing away from the substrate;
    a light-emitting layer disposed on one side of the first-type carrier layer facing away from the substrate;
    a second-type carrier layer disposed on one side of the light-emitting layer facing away from the substrate;
    a second electrode layer disposed on one side of the second-type carrier layer facing away from the substrate; and
    a leakage barrier control line disposed between the pixel definition layer and the first-type carrier layer and configured to form, in the first-type carrier layer, a potential barrier for the first-type carrier barrier that hinders a flow of a first-type carrier; wherein
    the first-type carrier layer is a hole conduction layer, and the second-type carrier layer is an electron-conduction layer; or the first-type carrier layer is an electron-conduction layer, and the second-type carrier layer is a hole conduction layer.

2. The display panel of claim 1, wherein the first-type carrier layer is the hole conduction layer, the second-type carrier layer is the electron-conduction layer, the leakage barrier control line is made of a metal material having a work function less than an electron affinity of the first-type carrier layer; or
    the first-type carrier layer is the electron-conduction layer, the second-type carrier layer is the hole conduction layer, the leakage barrier control line is made of a metal material having a work function greater than an electron affinity of the first-type carrier layer.

3. The display panel of claim 1, wherein the first-type carrier layer is the hole conduction layer, the second-type carrier layer is the electron-conduction layer, the leakage barrier control line comprises an N-type semiconductor having an electron affinity less than an electron affinity of the first-type carrier layer; or
    the first-type carrier layer is the electron-conduction layer, the second-type carrier layer is the hole conduction layer, the leakage barrier control line comprises a P-type semiconductor having an electron affinity greater than an electron affinity of the first-type carrier layer.

4. The display panel of claim 1, wherein the leakage barrier control line comprises a plurality of leakage barrier control branches, and the plurality of leakage barrier control branches are insulated from each other.

5. The display panel of claim 4, wherein each of the plurality of opening structures is surrounded by a ring shaped leakage barrier control branch.

6. The display panel of claim 4, wherein the plurality of leakage barrier control branches are electrically connected to each other.

7. The display panel of claim 6, wherein a vertical projection of the leakage barrier control line on the substrate is in a grid shape.

8. The display panel of claim 4, wherein a plurality of leakage barrier control branches are disposed between two adjacent opening structures, and barriers formed by the plurality of leakage barrier control branches disposed between the two adjacent opening structures are staggered.

9. The display panel of claim 4, wherein two adjacent leakage barrier control branches among a plurality of leakage barrier control branches disposed between two adjacent opening structures are made of different materials.

10. The display panel of claim 9, wherein one of the two adjacent leakage barrier control branches is made of a metal material, and another of the two leakage barrier control branches is made of a semiconductor material.

11. The display panel of claim 1, wherein the leakage barrier control line is in an electrically floating status.

12. The display panel of claim 1, wherein the leakage barrier control line is electrically connected to a potential input terminal.

13. The display panel of claim 12, further comprising an impedance circuit, wherein the leakage barrier control line is electrically connected to the potential input terminal through the impedance circuit.

14. The display panel of claim 1, further comprising an electrostatic discharge circuit, wherein the leakage barrier control line is electrically connected to the electrostatic discharge circuit.

15. The display panel of claim 1, further comprising a plurality of scanning lines, wherein each of the plurality of scanning lines is located right under a respective leakage barrier control line that a vertical projection of a scanning line on the substrate is within a vertical projection of the respective leakage barrier control line on the substrate.

* * * * *